United States Patent
Cheng et al.

(10) Patent No.: US 8,956,938 B2
(45) Date of Patent: Feb. 17, 2015

(54) EPITAXIAL SEMICONDUCTOR RESISTOR WITH SEMICONDUCTOR STRUCTURES ON SAME SUBSTRATE

(75) Inventors: Kangguo Cheng, Schenectady, NY (US); Ali Khakifirooz, Mountain View, CA (US); Alexander Reznicek, Mount Kisco, NY (US); Thomas N. Adam, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/472,747

(22) Filed: May 16, 2012

(65) Prior Publication Data

US 2013/0307074 A1 Nov. 21, 2013

(51) Int. Cl.
*H01L 21/336* (2006.01)
*H01L 27/088* (2006.01)

(52) U.S. Cl.
USPC ............... 438/238; 257/347; 257/379

(58) Field of Classification Search
CPC ............ H01L 27/0288; H01L 27/0738; H01L 29/8605; H01L 21/7624; H01L 21/76264; H01L 21/84; H01L 27/0629; H01L 27/1203
USPC .......... 257/350, 358, 379, 347; 438/155, 200, 438/171, 210, 238
See application file for complete search history.

(56) References Cited

U.S. PATENT DOCUMENTS

| | | | |
|---|---|---|---|
| 4,391,650 A | 7/1983 | Pfeifer et al. | |
| 5,344,785 A | 9/1994 | Jerome et al. | |
| 5,759,886 A | 6/1998 | Chung | |
| 6,294,834 B1 | 9/2001 | Yeh et al. | |
| 6,548,840 B1 | 4/2003 | Pobanz et al. | |

(Continued)

FOREIGN PATENT DOCUMENTS

| | | | | |
|---|---|---|---|---|
| EP | 111307 A2 | * | 6/1984 | ............. H01L 27/10 |
| JP | 03136363 A | * | 6/1991 | ............. H01L 21/31 |
| KR | 1020040042913 A | | 5/2004 | |

OTHER PUBLICATIONS

Oxford Dictionaries, "substantially", Oxford Dictionaries, Apr. 2010, Oxford Dictionaries, definition/american_english/.*

(Continued)

*Primary Examiner* — Khiem D Nguyen
*Assistant Examiner* — Pauline Vu
(74) *Attorney, Agent, or Firm* — Scully, Scott, Murphy & Presser, P.C.; Joe Petrokaitis (57) ABSTRACT

An electrical device is provided that includes a substrate having an upper semiconductor layer, a buried dielectric layer and a base semiconductor layer. At least one isolation region is present in the substrate that defines a semiconductor device region and a resistor device region. The semiconductor device region includes a semiconductor device having a back gate structure that is present in the base semiconductor layer. Electrical contact to the back gate structure is provided by doped epitaxial semiconductor pillars that extend through the buried dielectric layer. An epitaxial semiconductor resistor is present in the resistor device region. Undoped epitaxial semiconductor pillars extending from the epitaxial semiconductor resistor to the base semiconductor layer provide a pathway for heat generated by the epitaxial semiconductor resistor to be dissipated to the base semiconductor layer. The undoped and doped epitaxial semiconductor pillars are composed of the same epitaxial semiconductor material.

14 Claims, 3 Drawing Sheets

(56) References Cited

U.S. PATENT DOCUMENTS

| | | | |
|---|---|---|---|
| 6,573,565 B2* | 6/2003 | Clevenger et al. | 257/355 |
| 6,586,311 B2* | 7/2003 | Wu | 438/382 |
| 6,720,621 B1 | 4/2004 | Adan | |
| 2001/0025991 A1* | 10/2001 | Kim | 257/347 |
| 2003/0038323 A1* | 2/2003 | Kotani | 257/347 |
| 2003/0157787 A1* | 8/2003 | Murthy et al. | 438/507 |
| 2005/0020003 A1 | 1/2005 | Johansson et al. | |
| 2007/0040236 A1* | 2/2007 | Nowak et al. | 257/528 |
| 2007/0281418 A1 | 12/2007 | Hu et al. | |
| 2008/0054313 A1* | 3/2008 | Dyer et al. | 257/276 |
| 2008/0157202 A1* | 7/2008 | Cannon et al. | 257/351 |
| 2009/0057746 A1* | 3/2009 | Sugll et al. | 257/315 |
| 2009/0072290 A1* | 3/2009 | Cheng et al. | 257/303 |
| 2010/0156526 A1* | 6/2010 | Botula et al. | 327/581 |
| 2011/0108919 A1 | 5/2011 | Chinthakindi et al. | |
| 2011/0169089 A1 | 7/2011 | Doris et al. | |

OTHER PUBLICATIONS

Cheng, K., et al., "ETSOI CMOS for System-on-Chip Applications Featuring 22nm Gate Length, Sub-100nm Gate Pitch, and 0.08μm2 SRAM Cell", Symposium on VLSI Technology Digest of Technical Papers, Jun. 2011, pp. 128-129.

Khakifirooz, A., et al., "Fully Depleted Extremely Thin SOI for Mainstream 20nm Low-Power Technology and Beyond", IEEE International Solid-State Circuits Conference, Feb. 2010, pp. 152-153.

Doris, B., et al., "Substrate Rediness for ETSOI", IBM Research Division, Sep. 2010.

Doris, B., et al., "FDSOI for Low Power CMOS", IBM Research Division, Sep. 2010.

Cheng, K., et al., "Extreamly Thin SOI (ETSOI) CMOS with Record Low Variability for Low Power System-on-Chip Applications", IEEE, Dec. 2009.

Weber, O., et al., "High Immunity to Threshold Voltage Variability in Undoped Ultra-Thin FDSOI MOSFETs and its Physical Understanding", IEEE International Electron Devices Meeting, Dec. 2008.

Sugii, N., et al., "Comprehensive Study on Vth Variability in Silicon on Thin BOX (SOTB) CMOS with Small RandomDopant Fluctuation: Finding a Way to Further Reduce Variation", IEEE Electron Devices Meeting, Dec. 2008.

International Search Report dated Sep. 17, 2013 issued in PCT/US2013/040241.

* cited by examiner

EPITAXIAL SEMICONDUCTOR RESISTOR WITH SEMICONDUCTOR STRUCTURES ON SAME SUBSTRATE

BACKGROUND

The present disclosure relates to epitaxial semiconductor resistors and semiconductor devices.

For more than three decades, the continued miniaturization of silicon metal oxide semiconductor field effect transistors (MOSFETs) has driven the worldwide semiconductor industry. Various showstoppers to continued scaling have been predicated for decades, but a history of innovation has sustained Moore's Law in spite of many challenges. However, there are growing signs today that metal oxide semiconductor transistors are beginning to reach their traditional scaling limits. Since it has become increasingly difficult to improve MOSFETs and therefore complementary metal oxide semiconductor (CMOS) performance through continued scaling, further methods for improving performance in addition to scaling have become critical.

SUMMARY

The present disclosure provides a method of fabricating an electrical device including an epitaxial semiconductor resistor on a substrate including a buried dielectric layer, wherein an undoped epitaxial semiconductor pillar provides a path for the dissipation of heat produced by the epitaxial semiconductor substrate through the buried dielectric layer to a heat sink, such as a base semiconductor layer of the substrate. In one embodiment, the method of forming the electrical device includes providing a substrate including an upper semiconductor layer on a buried dielectric layer. The buried dielectric layer of the substrate is present on a base semiconductor layer. An isolation region is formed in the substrate through the semiconductor layer to define at least one semiconductor device region and a resistor device region. Epitaxial semiconductor pillars are formed in the isolation region and the upper semiconductor layer of the resistor device region. Each of the epitaxial semiconductor pillars is formed through the buried dielectric layer and is in contact with the base semiconductor layer. A back gate structure is formed in the base semiconductor layer of the at least one semiconductor device region, while a block mask is present over the resistor device region. The epitaxial semiconductor pillars that are present in the isolation region are in contact with the back gate structure and are doped, while the epitaxial semiconductor pillars that are present in the resistor device region are protected by the block mask and remain undoped. A raised source region, a raised drain region and an epitaxial semiconductor resistor are epitaxially deposited on the upper semiconductor layer. The raised source region and the raised drain region are present in the at least one semiconductor device region. The epitaxial semiconductor resistor is present in the resistor device region. The epitaxial semiconductor resistor is in contact with the base semiconductor layer through the epitaxial semiconductor pillars that are present in the resistor device region. The epitaxial semiconductor pillars that are present in the resistor device region remain undoped.

In another aspect, an electrical device is provided that includes at least one semiconductor device and an epitaxial semiconductor resistor. In one embodiment, the electrical device includes a substrate including an upper semiconductor layer on a buried dielectric layer, wherein the buried dielectric layer is present on a base semiconductor layer. An isolation region is present through the upper semiconductor layer to the buried dielectric layer. The isolation region is positioned to define at least one semiconductor device region and a resistor device region. At least one semiconductor device is present in the at least one semiconductor device region. The at least one semiconductor device includes a front gate structure on the upper semiconductor layer, a source region and a drain region on opposing sides of the front gate structure, and a back gate structure that is present in the base semiconductor layer. Electrical contact to the back gate structure is provided by a doped epitaxial semiconductor pillar extending through the buried dielectric layer. An epitaxial semiconductor resistor is present in the resistor device region. An undoped epitaxial semiconductor pillar extends from the epitaxial semiconductor resistor through the buried dielectric layer to the base semiconductor layer to provide a pathway for heat generated by the epitaxial semiconductor resistor to be dissipated to the base semiconductor layer. The undoped epitaxial semiconductor pillar is comprised of a same epitaxial semiconductor material as the doped epitaxial semiconductor pillars.

In yet another aspect, an electrical device is provided that includes at least one semiconductor device and an epitaxial semiconductor resistor. The at least one semiconductor device includes a substrate including an upper semiconductor layer on a buried dielectric layer, wherein the buried dielectric layer is present on a base semiconductor layer. An isolation region is present through the upper semiconductor layer to the buried dielectric layer. The isolation region is positioned to define at least one semiconductor device region and a resistor device region. At least one semiconductor device is present in the at least one semiconductor device region. The at least one semiconductor device includes a front gate structure on the upper semiconductor layer, a source region and a drain region on opposing sides of the front gate structure, and a back gate structure that is present in the base semiconductor layer. Electrical contact to the back gate structure is provided by a doped epitaxial semiconductor pillar extending through the buried dielectric layer. The doped epitaxial semiconductor pillars have a thermal conductivity that is less than 50 W/m/K. An epitaxial semiconductor resistor is present in the resistor device region. An undoped epitaxial semiconductor pillar extends from the epitaxial semiconductor resistor through the buried dielectric layer to the base semiconductor layer. The undoped epitaxial semiconductor pillars have a thermal conductivity of 50 W/m/K or greater.

BRIEF DESCRIPTION OF THE DRAWINGS

The following detailed description, given by way of example and not intended to limit the invention solely thereto, will best be appreciated in conjunction with the accompanying drawings, wherein like reference numerals denote like elements and parts, in which.

DETAILED DESCRIPTION

Detailed embodiments of the present disclosure are described herein; however, it is to be understood that the disclosed embodiments are merely illustrative of the structures and methods disclosed herein. In addition, each of the examples given in connection with the various embodiments of the disclosure is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the present disclosure. References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. For purposes of the description hereinafter, the terms "upper", "lower", "right", "left", "vertical", "horizontal", "top", "bottom", and derivatives thereof shall relate to the invention, as it is oriented in the drawing figures.

Extremely thin semiconductor on insulator (ETSOI) substrates with a thin buried oxide layer (also referred to as thin BOX) and a back gate structure can be a viable approach for continued scaling of complementary metal oxide semiconductor (CMOS) devices. The back gate structure may open opportunities for on-chip power management and device tuning System-on-chip (SOC) device arrangements require integration of various devices on the same chip. Resistors can be one of those devices. Typically, when a large electric current passes through a resistor, thermal heat is generated and the resistor temperature increase, which causes a variation in the resistivity of the resistor. This may be particularly true when an epitaxial semiconductor resistor is formed on a substrate having a buried dielectric layer, which is a thermal insulator.

In one embodiment, the present disclosure relates to a method for forming an epitaxial semiconductor resistor on a substrate including a buried dielectric layer, in which a pillar composed of an undoped epitaxial semiconductor material provides a pathway to dissipate heat from the epitaxial semiconductor resistor to the semiconductor material, e.g., base semiconductor layer, of the substrate that is underlying the buried dielectric layer. A "semiconductor resistor" is a device having a resistor body composed of a semiconductor material, i.e., semiconductor component, and terminals at opposing ends of the semiconductor material. Semiconductor devices, such as semiconductor devices including back gate structures, may be formed on the same substrate as the epitaxial semiconductor resistors. As used herein, a "semiconductor device" is an intrinsic semiconductor material that has been doped, i.e., into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. A "gate structure" means a structure used to control output current (i.e., flow of carriers in the channel, e.g., turn "on" or "off") of a semiconductor device through electrical or magnetic fields.

Figure 1:
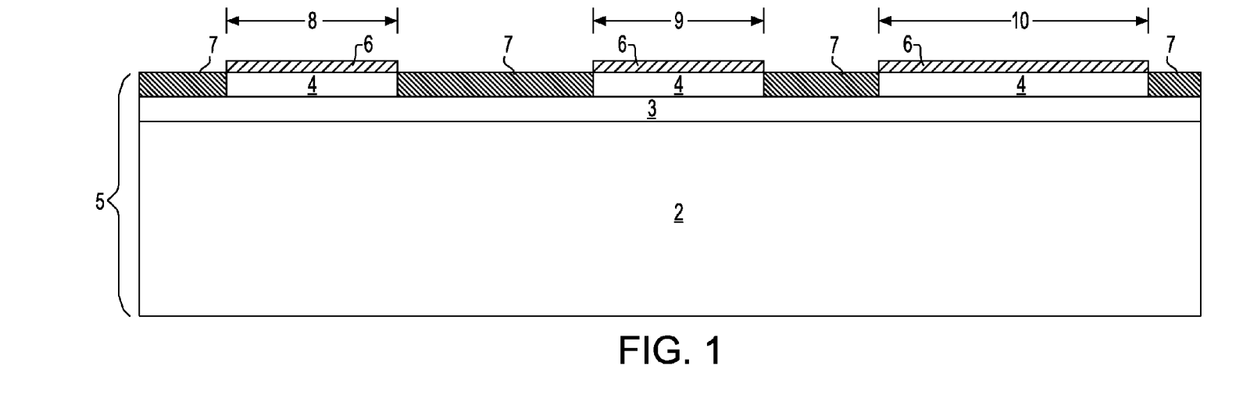
FIG. 1 is a side cross-sectional view depicting forming an isolation region in a substrate including an upper semiconductor layer over a buried dielectric layer, wherein the isolation region is formed through the semiconductor layer and into contact with buried dielectric layer, wherein the positioning of the isolation regions define at least one semiconductor device region and a resistor device region, in accordance with at least one embodiment of the methods and structures of the present disclosure.

FIG. 1 depicts one embodiment of a substrate 5 that may be suitable for use with the methods and structures disclosed herein. The substrate 5 may be a semiconductor on insulator (SOI) substrate, which may include an upper semiconductor layer 4 (also referred to as "semiconductor on insulator (SOI) layer"), a buried dielectric layer 3, and a base semiconductor layer 2. In one embodiment, the SOI substrate is an extremely thin semiconductor on insulator (ETSOI) substrate. An "ETSOI substrate" is a semiconductor on insulator (SOI) substrate, in which the semiconductor on insulator (SOI) layer has a thickness of 10 nm or less.

The upper semiconductor layer 4 may comprise any semiconducting material including, but not limited to silicon (Si), strained Si, SiC, SiGe, SiGeC, Si alloys, Ge, Ge alloys, GaAs, InAs, and InP, or any combination thereof. The upper semiconductor layer 4 may be thinned to a desired thickness for the substrate 5 by planarization, grinding, wet etch, dry etch, oxidation followed by oxide etch, or any combination thereof. One method of thinning the upper semiconductor layer 4 is to oxidize the silicon (Si) by a thermal dry or wet oxidation process, and then wet etch the oxide layer using a hydrofluoric (HF) acid mixture. This process can be repeated to achieve the desired thickness. In one embodiment, the upper semiconductor layer 4 of the substrate 5 has a thickness ranging from 1.0 nm to 10.0 nm. In another embodiment, the upper semiconductor layer 4 has a thickness ranging from 1.0 nm to 5.0 nm. In a further embodiment, the upper semiconductor layer 4 has a thickness ranging from 3.0 nm to 8.0 nm.

Besides ETSOI, the upper SOI layer can be thicker than 10 nm and used to form finFET, trigate, PDSOI (partially depleted SOI) devices. In finFET/trigate case, the source/drain epitaxial semiconductor will be employed to widen and/or merge source/drain of fins. In PDSOI case, the source/drain epitaxial semiconductor material can be embedded source/drain, i.e., recessing SOI in the source/drain region and then epitaxially fill the recessed source/drain with epitaxial semiconductor material.

The base semiconductor layer 2 may be a semiconducting material including, but not limited to Si, strained Si, SiC, SiGe, SiGeC, Si alloys, Ge, Ge alloys, GaAs, InAs, InP as well as other III/V and II/VI compound semiconductors. The buried dielectric layer 3 may be composed of any dielectric material. For example, the buried dielectric layer 3 may be composed of an oxide, e.g., silicon oxide, a nitride, e.g., silicon nitride, silicon oxynitride, rare earth metal oxide or a combination thereof. The buried dielectric layer 3 may have a thickness of 30 nm or less. In another embodiment, the buried dielectric layer 3 may have a thickness ranging from 5.0 nm to 25.0 nm. In yet another embodiment, the buried dielectric layer 3 may have a thickness ranging from 10.0 nm to 15.0 nm.

The buried dielectric layer 3 that is present underlying the upper semiconductor layer 4 and atop the base semiconductor layer 2 may be formed by implanting a high-energy dopant into the substrate 5 and then annealing the structure to form a buried insulating layer, i.e., dielectric layer 3. In another embodiment, the dielectric layer 3 may be deposited or grown prior to the formation of the upper semiconductor layer 4. In yet another embodiment, the substrate 5 including the upper semiconductor layer 4, the buried dielectric layer 3 and the base semiconductor layer 2 may be formed using wafer-bonding techniques, where a bonded wafer pair is formed utilizing glue, adhesive polymer, or direct bonding.

In one embodiment, a pad dielectric layer 6 may be formed on an upper surface of the substrate 5, e.g., on an upper surface of the upper semiconductor layer 4. In one embodiment, the pad dielectric layer 6 may be composed of an oxide, nitride or oxynitride material, but any dielectric material may be suitable for the pad dielectric layer 6. For example, the pad dielectric layer 6 may be composed of silicon nitride on top of silicon oxide ($SiO_2$). The pad dielectric layer 6 may be formed using a deposition method or a growth method. For example, the pad dielectric layer 6 may be formed using chemical vapor deposition (CVD), such as plasma enhanced chemical vapor deposition (PECVD). In another embodiment, the pad dielectric layer 6 may be formed using a thermal growth process, such as thermal oxidation or thermal nitridation. The pad dielectric layer 6 may have a thickness ranging from 1 nm to 20 nm. In another embodiment, the pad dielectric layer 6 may have a thickness ranging from 5 nm to 10 nm.

FIG. 1 further depicts one embodiment of forming an isolation region 7 in the substrate 5. The isolation region 7 may be composed of any dielectric material, such as oxides, nitrides or oxynitride dielectrics. For example, the isolation region 7 may be composed of silicon oxide ($SiO_2$) or silicon nitride. The isolation region 7 may be formed through the upper semiconductor layer 4 and may be in contact with the upper surface of the buried dielectric layer 3. The positioning of the isolation region 7 in the substrate 5 defines at least one semiconductor device region 8, 9 and a resistor device region 10. In one embodiment, the isolation region 7 is formed by forming a trench in the substrate 5 utilizing a dry etching process, such as reactive-ion etching (RIE) or plasma etching, and then filling the trench with an insulating material, such as an oxide, e.g., silicon oxide ($SiO_2$). In one embodiment, the trench for the isolation region 7 may be formed using an etch mask (not shown), e.g., photoresist mask, in combination with a selective etch process. For example, a first etch process may remove the material of the pad dielectric layer 6 selectively to the photoresist mask and the upper semiconductor layer 4. In a following second etch process, the exposed portions of the upper semiconductor layer 4 may be removed by an etch that is selective to the buried dielectric layer 3. In some examples, the etch mask may be removed prior to the second etch process, wherein the etched portion of the pad dielectric layer 6 may function as an etch mask during etching of the exposed portions of the upper semiconductor layer 4 with the second etch process. In one embodiment, the trench may be filled using a deposition method, such as chemical vapor deposition (CVD). In the embodiment depicted in FIG. 1, the isolation region 7 is positioned to provide a p-type semiconductor device region 8 and an n-type semiconductor device region 9, which are separated from a resistor device region 10.

Figure 2:
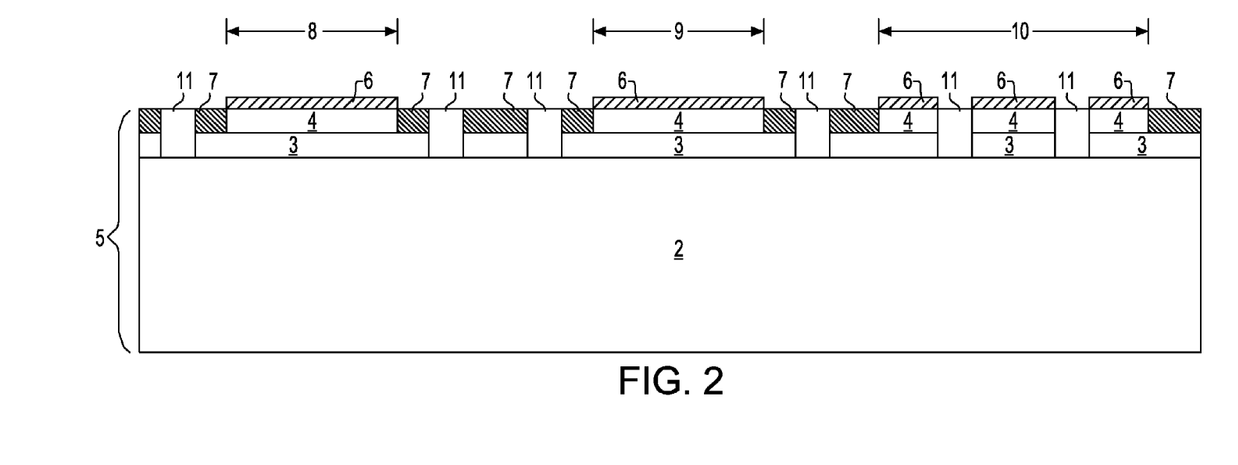
FIG. 2 is a side cross-sectional view depicting forming epitaxial semiconductor pillars in the isolation region and the upper semiconductor layer of the resistor device region, wherein each of the epitaxial semiconductor pillars are formed through the buried dielectric layer and into contact with a base semiconductor layer of the substrate, in accordance with one embodiment of the present disclosure.

FIG. 2 depicts one embodiment of forming epitaxial semiconductor pillars 11 in the isolation region 7 and the upper semiconductor layer 4 of the resistor device region 10. In one embodiment, each of the epitaxial semiconductor pillars 11 are formed through the upper semiconductor layer 4 and the buried dielectric layer 3 and into contact, e.g., direct contact, with a base semiconductor layer 2 of the substrate 5. By "epitaxial material" it is meant that the semiconductor material of the epitaxial semiconductor pillars 11 has the same crystalline orientation as the base semiconductor layer 2 that the epitaxial semiconductor pillars 11 are in direct contact with. In one embodiment, forming the epitaxial semiconductor pillars 11 may begin with forming an etch mask on the substrate 5, wherein the openings in the etch mask correspond to the portions of the substrate 5 in which the epitaxial semiconductor pillars 11 are to be formed. In one example, the etch mask may be a photoresist mask. For example, a photoresist etch mask can be produced by blanket depositing a photoresist layer to the upper surface of the substrate 5, e.g., the upper surface of the upper semiconductor layer, and the upper surface of the isolation region 7, exposing the photoresist layer to a pattern of radiation, and then developing the pattern into the photoresist layer utilizing a resist developer. The openings in the photoresist mask may be positioned to provide pillar openings in the isolation region 7 adjacent to the at least one semiconductor device region 8, 9, and pillar openings in the upper semiconductor layer 4 that is present in the resistor device region 10.

The exposed portion of the isolation region 7 and the upper semiconductor layer 4 within the resistor device region 10 are then removed to provide the pillar openings by a selective etch. As used herein, the term "selective" in reference to a material removal process denotes that the rate of material removal for a first material is greater than the rate of removal for at least another material of the structure to which the material removal process is being applied. For example, a first material may be removed selectively to a second material by an etch rate ratio of 10:1. In another example, the first material may be removed selectively to the second material by an etch rate ratio of 100:1. In some embodiments, the etch chemistry for forming the pillar openings is selected to remove the material of exposed portions of the pad dielectric layer 6, the upper semiconductor layer 4, the isolation region 7, and the buried dielectric layer 3 so that the base of the pillar openings is in contact with the base semiconductor layer 2 of the substrate 5. In some embodiments, the etch process for forming the pillar openings may be an anisotropic etch. Examples of anisotropic etch processes that are suitable for forming the pillar openings include reactive-ion etching (RIE), ion beam etching, or plasma etching. Following the formation of the pillar openings, the photoresist layer may be removed by a chemical strip method, oxygen ashing or selective etching.

Referring to FIG. 2, the pillar openings may be filled with epitaxially deposited semiconductor material to provide the epitaxial semiconductor pillars 11. "Epitaxially growing, epitaxial growth and/or deposition" mean the growth of a semiconductor material on a deposition surface of a semiconductor material, in which the semiconductor material being grown has the same crystalline characteristics as the semiconductor material of the deposition surface. When the chemical reactants are controlled and the system parameters set correctly, the depositing atoms arrive at the deposition surface with sufficient energy to move around on the surface and orient themselves to the crystal arrangement of the atoms of the deposition surface. Thus, an epitaxial film deposited on a {100} crystal surface will take on a {100} orientation. In some embodiments, the epitaxial deposition process is a selective deposition process. More specifically, in one embodiment, the epitaxial semiconductor material being deposited for the epitaxial semiconductor pillars 11 is only deposited on semiconductor containing deposition surfaces, such as the portions of the base semiconductor layer 2 that are exposed by the pillar openings. The epitaxial semiconductor material being deposited for the epitaxial semiconductor pillars 11 is typically not deposited on dielectric materials, such as the pad dielectric layer 6 that are present on the upper surface of the upper semiconductor layer 4 and the isolation region 7.

The epitaxial semiconductor pillars 11 may be composed of any semiconductor material that can be epitaxially deposited. Some examples of semiconductor materials that are suitable for the epitaxial semiconductor pillars 11 include silicon (Si), germanium (Ge), and silicon germanium (SiGe). It is noted that the these specific material compositions for the epitaxial semiconductor pillars 11 are provided for illustrative purposes only, and are not intended to limit the present disclosure, as any semiconductor material that may be formed using an epitaxial growth process is suitable for the epitaxial semiconductor pillars 11. A number of different sources may be used for the deposition of epitaxial silicon. In some embodiments, in which the epitaxial semiconductor pillars 11 are composed of silicon, the silicon gas source for epitaxial deposition may be selected from the group consisting of hexachlorodisilane ($Si_2Cl_6$), tetrachlorosilane ($SiCl_4$), dichlorosilane ($Cl_2SiH_2$), trichlorosilane ($Cl_3SiH$), methylsilane (($CH_3$)$SiH_3$), dimethylsilane (($CH_3$)$_2SiH_2$), ethylsilane (($CH_3CH_2$)$SiH_3$), methyldisilane (($CH_3$)$Si_2H_5$), dimethyldisilane (($CH_3$)$_2Si_2H_4$), hexamethyldisilane (($CH_3$)$_6Si_2$) and combinations thereof. In some embodiments, in which the epitaxial semiconductor pillars 11 are composed of germanium, the germanium gas source for epitaxial deposition may be selected from the group consisting of germane ($GeH_4$), digermane ($Ge_2H_6$), halogermane, dichlorogermane, trichlorogermane, tetrachlorogermane and combinations thereof. In some embodiments, in which the epitaxial semiconductor pillars 11 are composed of silicon germanium, the silicon sources for epitaxial deposition may be selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof, and the germanium gas sources may be selected from the group consisting of germane, digermane, halogermane, dichlorogermane, trichlorogermane, tetrachlorogermane and combinations thereof.

The temperature for epitaxial silicon deposition typically ranges from 550° C. to 900° C. Although higher temperature typically results in faster deposition, the faster deposition may result in crystal defects and film cracking. The apparatus for performing the epitaxial growth may include a chemical vapor deposition (CVD) apparatus, such as atmospheric pressure CVD (APCVD), low pressure CVD (LPCVD), plasma enhanced CVD (PECVD), metal-organic CVD (MOCVD) and others. The epitaxial semiconductor material that is deposited within the pillar openings to provide epitaxial semiconductor pillars 11 is not doped with p-type or n-type dopants. By "not doped" or "undoped" it is meant that the maximum dopant concentration of p-type or n-type dopants that are present in the epitaxial semiconductor material is less than $5 \times 10^{17}$ atoms/cm$^3$.

In some embodiments, following formation of the epitaxial semiconductor pillars 11, the pad dielectric layer 6 is removed from the upper semiconductor layer 4 of the substrate 5. In one embodiment, the pad dielectric layer 6 is removed by an etch process that is selective to the epitaxial semiconductor pillars 11, the upper semiconductor layer 4, and the isolation region 7. The etch process may be a wet etch, such as a wet chemical etch, or may be a dry etch, such as a plasma etch or reactive ion etching.

Figure 3:
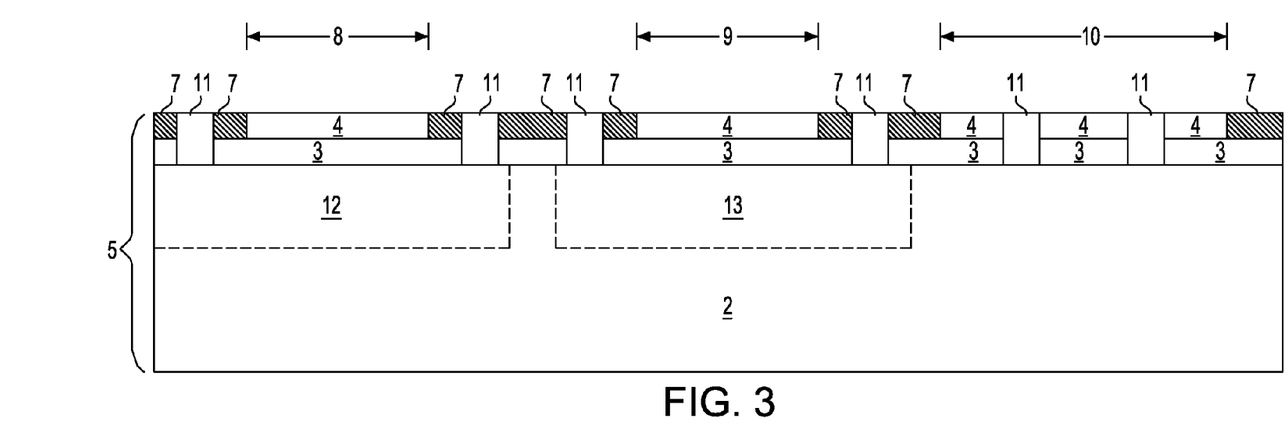
FIG. 3 is a side cross-sectional view depicting forming a back gate structure in the base semiconductor layer for each of the semiconductor device regions, in accordance with one embodiment of the present disclosure.

FIG. 3 depicts forming a back gate structure 12, 13 in the base semiconductor layer 2 of the substrate 5 for each of the semiconductor device regions 8, 9. A back gate structure 12, 13 is a gate structure that employs the buried dielectric layer 3 of the substrate 5 as the gate dielectric of the gate structure, and employs a conductive portion of the base semiconductor layer 2 of the substrate 5 as the gate conductor of the gate structure. In one embodiment, the conductive portion of the base semiconductor layer 3 is a semiconductor material, e.g., the material of the base semiconductor layer 2, that is doped with an n-type or p-type dopant. The terms "doping" and "doped" denote adding dopant atoms to an intrinsic semiconductor, which changes the electron and hole carrier concentrations of the intrinsic semiconductor at thermal equilibrium. As used herein, "p-type" refers to the addition of impurities to an intrinsic semiconductor that creates deficiencies of valence electrons. In a silicon containing base semiconductor layer 2, examples of p-type dopants, i.e., impurities, include but are not limited to boron, aluminum, gallium and indium. As used herein, "n-type" refers to the addition of impurities that contributes free electrons to an intrinsic semiconductor. In a silicon containing base semiconductor layer 2 examples of n-type dopants, i.e., impurities, include but are not limited to, antimony, arsenic and phosphorous.

In one embodiment, the dopant for the back gate structures 12, 13 may be introduced to selected portions of the base semiconductor layer 4 of the substrate 5 using block masks in combination with ion implantation. The block mask may be a photoresist mask similar to the photoresist mask that is described above for selectively etching the portions of the substrate 5 for providing the pillar openings for the epitaxial semiconductor pillars 11. In some embodiments, the block mask may protect the resistor device region 10 of the substrate 5, while the back gate structures 12, 13, are formed in the semiconductor device regions 8, 9. The openings in the block mask may position the back gate structure 12, 13 so that they are in contact with at least one of the epitaxial semiconductor pillars 11 that extend through the isolation region 7. In some embodiments, that include multiple semiconductor device regions 8, 9, as depicted in FIG. 3, block masks may also be employed to implant each of the semiconductor device regions 8, 9 separately. For example, in the embodiments in which there are multiple semiconductor device regions, the back gate structures 12 of the p-type semiconductor device regions 8 may be doped with an n-type dopant, while the n-type semiconductor device region 9 and the resistor device region 10 are protected by a first block mask. Thereafter, the first block mask may be removed, and the back gate structures 13 of the n-type semiconductor device regions 9 may be doped with an p-type dopant, while the p-type semiconductor device region 8 and the resistor device region 10 are protected by a second block mask.

In one embodiment, the implant energy of the ion implantation process is selected so that the dopant for the back gate structures 12, 13 is implanted through the upper semiconductor layer 4, the epitaxial semiconductor pillars 11, the isolation region 7, and the buried dielectric layer 3 so that a peak concentration for the dopant of the back gate structures 12, 13 is positioned within the base semiconductor layer 2. The implant energy may depend upon the dopant type, as well as the thickness of the upper semiconductor layer 4 and the base semiconductor layer 3. In some embodiments, the implant energy may range from 5 keV to 500 keV. In another embodiment, the implant energy may range from 20 keV to 100 keV. The dopant may be present in each of the back gate structures 12, 13 in a concentration that is greater than $2\times10^{18}$ atoms/cm$^3$. In another embodiment, the concentration of dopant in each of the back gate structures 12, 13 ranges from $1\times10^{19}$ atoms/cm$^3$ to $1\times10^{21}$ atoms/cm$^3$. In yet another embodiment, the concentration of dopant in each of the back gate structures 12, 13 may range from $2\times10^{19}$ atoms/cm$^3$ to $2\times10^{20}$ atoms/cm$^3$. Because, the dopants are being implanted through the epitaxial semiconductor pillars 11, at this stage of the process flow, the epitaxial semiconductor pillars 11 may still remain undoped.

Still referring to FIG. 3, in some embodiments, following the formation of the back gate structures 12, 13, the epitaxial semiconductor pillars 11 that are in contact with the back gate structures 12, 13 may be doped with a p-type or n-type dopant to provide for electrically connectivity to the back gate structures 12, 13 from the upper surface of the substrate 5. As used herein, the term "electrical connectivity" means a material having a room temperature (20° C. to 25° C.) conductivity of greater than $10^{-8}(\Omega\text{-m})^{-1}$. The epitaxial semiconductor pillars 11 that are in contact with the back gate structures 12, 13 are typically present extending through the isolation region and are typically adjacent to the semiconductor device regions 8, 9. In some embodiments, the epitaxial semiconductor pillars 11 that are present in the semiconductor device region 8, 9 are doped to have the same conductivity type as the back gate structures 12, 13 that they are in contact with. For example, in a p-type conductivity semiconductor device region 8 having an n-type back gate structure 12, the epitaxial semiconductor pillars 11 that are in contact with the n-type back gate structure 12 will also be doped to an n-type conductivity. In another example, in an n-type conductivity semiconductor device region 9 having a p-type back gate structure 13, the epitaxial semiconductor pillars 11 that are in contact with the p-type back gate structure 13 will also be doped to a p-type conductivity. The epitaxial semiconductor pillars 11 that are present in the resistor device region 10 may be protected by a block mask during doping of the epitaxial semiconductor pillars 11 to the back gate structures 12, 13, and remain undoped.

In some embodiments, ion implantation in combination with block masks (also reffered to as dopant implantation masks) may be employed to selectively dope the epitaxial semiconductor pillars 11. For example, when doping the epitaxial semiconductor pillars 11 to the n-type back gate structure 12 in the p-type semiconductor device region 8, a block mask may protect the entirety of the n-type semiconductor device region 9 and the resistor device region 10. The block mask for doping the epitaxial semiconductor pillars 11 to the n-type back gate structure 12 in the p-type semiconductor device region 8 may also protect the portions of the p-type semiconductor device region 8 that do not contain the epitaxial semiconductor pillars 11 so that the implanted dopant is only introduced to the exposed epitaxial semiconductor pillars 11. When doping the epitaxial semiconductor pillars 11 to the p-type back gate structure 13 in the n-type semiconductor device region 9, a block mask may protect the entirety of the p-type semiconductor device region 8 and the resistor device region 10. The block mask for doping the epitaxial semiconductor pillars 11 to the p-type back gate structure 13 in the n-type semiconductor device region 9 may also protect the portions of the n-type device region 9 that do not contain the epitaxial semiconductor pillars 11 so that the implanted dopant is introduced to only the exposed epitaxial semiconductor pillars 11.

In one embodiment, the implant energy of the ion implantation process for doping the epitaxial semiconductor pillars 11 ranges from 1 keV to 200 keV. In another embodiment, the implant energy of the ion implantation process for doping the epitaxial semiconductor pillars 11 ranges from 5 keV to 50 keV. The dopant may be present in each of the epitaxial semiconductor pillars 11 to the back gate structures 12, 13 in a concentration that is greater than $5\times10^{17}$ atoms/cm$^3$. In another embodiment, the concentration of dopant in each of the epitaxial semiconductor pillars 11 ranges from $1\times10^{20}$ atoms/cm$^3$ to $1\times10^{21}$ atoms/cm$^3$. In yet another embodiment, the concentration of dopant in each of the epitaxial semiconductor pillars 11 may range from $1\times10^{20}$ atoms/cm$^3$ to $5\times10^{20}$ atoms/cm$^3$. Because, the resistor device region 10 is typically protected by a block mask as the epitaxial semiconductor pillars 11 to the back gate structures 12, 13 are doped, the epitaxial semiconductor pillars 11 that are present in the resistor device region 10 may still remain undoped.

Figure 4:
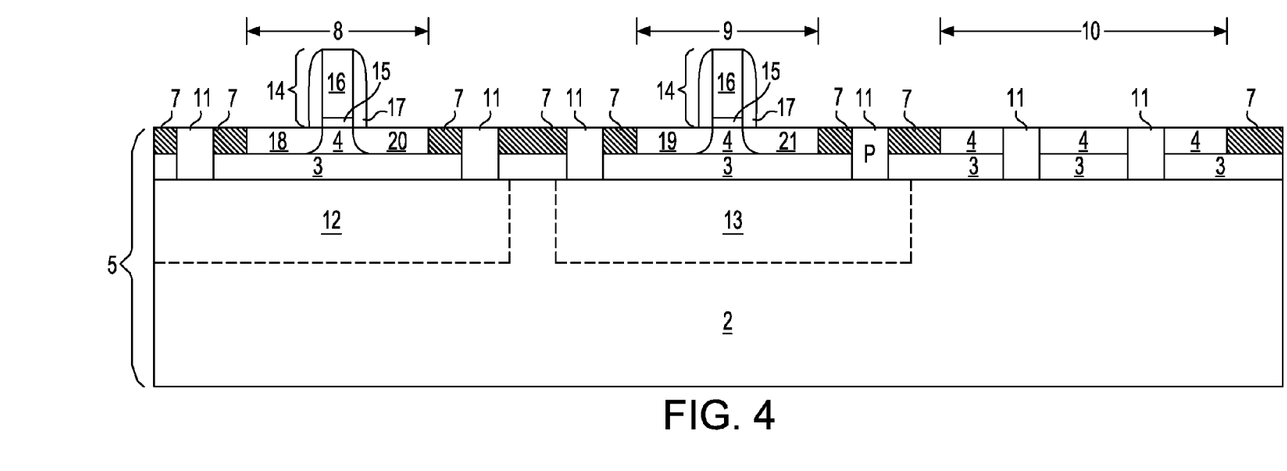
FIG. 4 is a side cross-sectional view depicting forming a front gate structure in each of the semiconductor device regions, and forming source and drain regions in the upper semiconductor layer of each of the semiconductor device regions, in accordance with one embodiment of the present disclosure.

FIG. 4 depicts one embodiment of forming a front gate structure 14 in each of the semiconductor device regions 8, 9. The front gate structure 14 is present on the upper semiconductor layer 4 and includes a gate dielectric layer 15 that is deposited on the upper surface of the substrate 5 and a gate conductor 16 that is present on the gate dielectric layer 15. Typically, there is at least one front gate structure 14 present in each of the semiconductor device regions 8, 9. In one embodiment, the front gate structures 14 are formed atop the substrate 5 utilizing deposition, lithography, and etching. In one embodiment, a gate stack is first provided atop the substrate 5 by depositing a gate dielectric layer and then a gate conductor layer using forming methods, such as chemical vapor deposition and/or thermal growth. Thereafter, the gate stack is patterned and etched to provide the front gate structure 14.

In one embodiment, the gate dielectric 15 is an oxide material and is greater than 0.8 nm thick. In another embodiment, the gate dielectric 15 may have a thickness ranging from 1.0 nm to 6.0 nm. In one embodiment, the gate dielectric 15 is a high-k gate dielectric comprised of an insulating material having a dielectric constant of greater than 4.0 at room temperature, i.e., 20° C. to 25° C. More specifically, the high-k gate dielectric employed in the present disclosure may include, but not limited to, an oxide, nitride, oxynitride and/or silicate including metal silicates and nitrided metal silicates. In one embodiment, the gate dielectric 15 is comprised of an oxide such as, for example, $HfO_2$, $ZrO_2$, $Al_2O_3$, $TiO_2$, $La_2O_3$, $SrTiO_3$, $LaAlO_3$, $Y_2O_3$ and mixtures thereof. The gate dielectric 15 may also be composed of hafnium silicate or hafnium silicon oxynitride.

The gate conductor 16 may be comprised of polysilicon and/or a metal. The gate conductor 16 is formed atop the gate dielectric 15 utilizing a deposition process, such as CVD and/or sputtering. In one embodiment, the gate conductor 16 comprises doped polysilicon. The polysilicon dopant can be elements from group III-A or a group V-A of the Periodic Table of Elements. The dopant may be introduced during deposition of the gate conductor layer or following subsequent patterning and etching of the gate conductor 16.

In one embodiment, following the formation of the front gate structure 15, a dielectric spacer 17 is formed abutting and protecting the sidewalls of each front gate structure 15. In one embodiment, the dielectric spacer 17 is an oxide or nitride, such as $SiO_2$ or $Si_3N_4$. The dielectric spacer 17 typically has a width that ranges from 1 nm to 20 nm. Forming processes such as deposition or thermal growing may produce the dielectric spacer 17. The dielectric spacer 17 can be optional and may be omitted.

FIG. 4 further depicts and forming source extension regions 18, 19 and drain extension regions 20, 21 in the upper semiconductor layer 4 of each of the semiconductor device regions 8, 9. As used herein, the term "source" is a doped region in the semiconductor device, in which majority carriers are flowing into the channel. As used herein, the term "drain" means a doped region in semiconductor device located at the end of the channel, in which carriers are flowing out of the semiconductor device through the drain. The "channel region" is between the source and drain of the semiconductor device and becomes conductive when the semiconductor device is turned on. The source extension regions 18, 19 and the drain extension regions 20, 21 are formed via ion implantation. Block masks may be employed to select the regions of the substrate 5 to be implanted for forming the source extension regions 18, 19 and the drain extension regions 20, 21. For example, when forming the p-type source extension region 18 and the p-type drain extension region 20 of the p-type semiconductor device region 8 by ion implantation of a p-type dopant, a block mask may be formed over the n-type semiconductor device region 9 and the resistor device region 10. When forming the p-type source extension region 20 and the n-type drain extension region 21 of the n-type semiconductor device region 9 by ion implantation of an n-type dopant, a block mask may be formed over the p-type semiconductor device region 8 and the resistor device region 10. In some embodiments, each of the semiconductor device regions 8, 9 may further includes deep source and drain regions (not shown). The deep source and drain regions typically have the same conductivity type as the source and drain extension regions 18, 19, 20, 21, but the deep source and drain regions are typically implanted with a higher implantation energy, and extend to a greater depth within the substrate 5 than the source and drain extension regions 18, 19, 20, 21.

Figure 5:
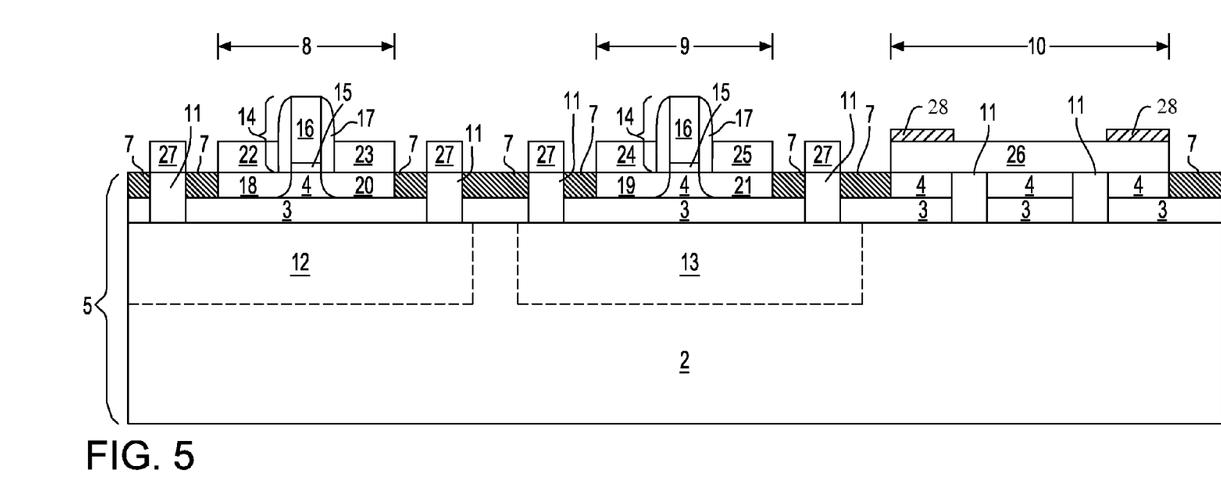
FIG. 5 is a side cross-sectional view depicting one embodiment of epitaxially depositing raised source regions, raised drain regions and an epitaxial semiconductor resistor, wherein the raised source regions and the raised drain regions are present in the semiconductor device regions and the epitaxial semiconductor resistor is present in the resistor device region, in accordance with the present disclosure.

FIG. 5 depicts one embodiment of epitaxially depositing a raised source region 22, 24, a raised drain region 23, 25 and an epitaxial semiconductor resistor 26. The term "raised" as used to describe the raised source and drain regions 22, 23, 24, 25 means that the lower surface of the raised source and drain regions 22, 23, 24, 25 is in direct physical contact with the upper surface of the upper semiconductor layer 4 of the substrate 5. The epitaxial deposition process for forming the raised source regions 22, 24, the raised drain region 23, 25 and the epitaxial semiconductor resistor 26 is similar to the epitaxial deposition process for forming the epitaxial semiconductor pillar 11 that is described above with reference to FIG. 2. Therefore, the description of the epitaxial deposition process for forming the epitaxial semiconductor pillar 11 that is made above with reference to FIG. 2 is suitable for the epitaxial deposition process for forming the raised source regions 22, 24, the raised drain regions 23, 25 and the epitaxial semiconductor resistor 26. The epitaxial semiconductor material for the raised source regions 22, 24, the raised drain regions 23, 25, and the epitaxial semiconductor resistor 26 may be any semiconductor material that may be formed using an epitaxial deposition process including, but not limited to, silicon (Si), silicon germanium (SiGe) and germanium (Ge).

In one embodiment, the epitaxial semiconductor material for the raised source region 22 and raised drain region 23 in the p-type semiconductor device region 8 may be silicon germanium (SiGe), and the epitaxial semiconductor material for the raised source region 24 and the raised drain region 25 in the n-type semiconductor device region 9 may be silicon (Si). The epitaxial semiconductor material for the epitaxial semiconductor resistor 26 may be the same material composition as at least one of the raised source region 22 and raised drain region 23 in the p-type semiconductor device region 8 and the raised source region 24 and the raised drain region 25 in the n-type semiconductor device region 9. In some embodiments, to provide two materials of the same material composition on different regions of the substrate 5, the same materials may be formed using the same deposition process, e.g., same epitaxial deposition process. Block masks may be used to select the regions of the substrate 5 in which the epitaxial semiconductor material is to be deposited. The block masks employed at this stage of the process sequence may be similar to the block masks described above for forming the epitaxial semiconductor pillars 11. Therefore, the description of the block mask that are employed for forming the epitaxial semiconductor pillars 11 that is made above with reference to FIG. 2 is suitable for the block masks that are used to select the region of the substrate in which the epitaxial semiconductor material is being deposited for the raised source regions 22, 24, the raised drain regions 23, 25, and the epitaxial semiconductor resistor 26. In one example, the block masks are composed of a photoresist material and are formed using photolithography processing.

The epitaxial deposition process may be a selective deposition process, in which the epitaxial semiconductor material being deposited may only be formed on semiconductor materials. In some embodiments, a cap epitaxial semiconductor material 27 may be formed on each of the epitaxial semiconductor pillars 11 that extend through the isolation region 7 into contact with the back gate structures 12, 13.

The raised source regions 22, 24, and the raised drain regions 23, 25 are typically doped to have a conductivity type that is the same as the source extension regions 18, 19 and drain extension regions 20, 21 of the semiconductor devices that are included in the p-type semiconductor device region 8 and the n-type semiconductor device region 9. For example, the raised source and drain regions 22, 23 in the p-type semiconductor device region 8 are typically doped with a p-type dopant, and the raised source and drain regions 24, 25 in the n-type semiconductor device region 9 are typically doped with an n-type dopant. In some embodiments, the raised source regions 22, 24 and the raised drain regions 23, 25 are in-situ doped. The term "in-situ doped" means that the dopant that provides the conductivity type, i.e., n-type or p-type, of the raised source regions 22, 24, and the raised drain regions 23, 25 is introduced during the epitaxial growth process that provides the semiconductor material of the raised source regions 22, 24, and the raised drain regions 23, 25. In other embodiments, the raised source regions 22, 24, and the raised drain regions 23, 25 may be doped to a p-type or n-type conductivity using ion implantation. Block masks, such as photoresist masks, may be employed to select the regions of the substrate 5 being ion implanted. In one example, the raised source region 22 and the raised drain region 23 are composed of epitaxially deposited silicon germanium that is in-situ doped with boron (B) to provide a p-type conductivity, in which the concentration of the boron (B) dopant ranges from $1 \times 10^{18}$ atoms/cm$^3$ to $2 \times 10^{21}$ atoms/cm$^3$. In one example, the raised source region 24 and the raised drain region 25 are composed of epitaxially deposited silicon that is in-situ doped with phosphorus (P) to provide an n-type conductivity, in which the concentration of the phosphorus (P) dopant ranges from $1 \times 10^{18}$ atoms/cm$^3$ to $2 \times 10^{21}$ atoms/cm$^3$.

Although FIGS. 1-5 depict field effect transistors (FET) being formed within the p-type semiconductor device region 8 and the n-type semiconductor device region 9, the present disclosure is not limited to only this type of semiconductor device. For example, the semiconductor device that is present in the p-type semiconductor device region 8 and the n-type semiconductor device region 9 may be a finFET semiconductor device, a Schottky barrier device or a junction field effect (JFET) field effect transistor.

The cap epitaxial semiconductor material 27 that is formed over the epitaxial semiconductor pillars 11 is typically doped to have the same conductivity type as the epitaxial semiconductor pillar 11 that the cap epitaxial semiconductor material 27 is in contact with. For example, when the epitaxial semiconductor pillar 11 that is in contact with the back gate structure 12 in the p-type semiconductor device region 8 has an n-type conductivity, the cap epitaxial semiconductor material 27 is doped with an n-type dopant to also have an n-type conductivity. For example, when the epitaxial semiconductor pillar 11 that is in contact with the back gate structure 13 in the n-type semiconductor device region 9 has a p-type conductivity, the cap epitaxial semiconductor material 27 is doped with a p-type dopant to also have a p-type conductivity. The cap epitaxial semiconductor material 27 may be doped using ion implantation or in-situ doping. Block masks may be employed to selectively implant the cap epitaxial semiconductor material 27.

The epitaxial semiconductor resistor 26 may be composed of same composition epitaxial semiconductor material as at least one of the raised source regions 22, 25 and the raised drain regions 23, 25. The epitaxial semiconductor resistor 26 is typically doped to have a resistivity greater than 0.0001 ohm-cm and less than 0.1 ohm-cm. The epitaxial semiconductor resistor 26 may be in-situ doped or may be doped using ion implantation.

In one embodiment, the epitaxial semiconductor resistor 26 is composed of silicon germanium (SiGe) and is doped with a p-type dopant, such as boron (B), to have a p-type conductivity. In one embodiment, the epitaxial semiconductor resistor 26 may be composed of the same epitaxial semiconductor material as the raised source region 22 and the raised drain region 23 in the p-type semiconductor device region 8, and may be doped with the same composition dopant at the same concentration of the raised source region 22 and the raised drain region 23 in the p-type semiconductor device region 8. In one example, in which the epitaxial semiconductor resistor 26 is composed of boron doped silicon germanium (SiGe), the concentration of boron (B) in the epitaxial semiconductor resistor 26 may range from $1\times10^{18}$ atoms/cm$^3$ to $2\times10^{21}$ atoms/cm$^3$.

In one embodiment, the epitaxial semiconductor resistor 26 may be composed of the same epitaxial semiconductor material as the raised source region 24 and the raised drain region 25 in the n-type semiconductor device region 9, and may be doped with the same dopant type at the same concentration of the raised source region 24 and the raised drain region 25 in the n-type semiconductor device region 9. In one example, in which the epitaxial semiconductor resistor 26 is composed of phosphorus doped silicon (Si), the concentration of phosphorus (P) in the epitaxial semiconductor resistor 26 may range from $1\times10^{18}$ atoms/cm$^3$ to $2\times10^{21}$ atoms/cm$^3$.

The epitaxial semiconductor resistor 26 is epitaxially deposited in direct contact with the upper semiconductor layer 4 and the epitaxial semiconductor pillars 11 that are present in the resistor device region 10 of the substrate 5. The epitaxial semiconductor pillars 11 that are present in the resistor device region 10, which may be in direct contact with the epitaxial semiconductor resistor 26, remain undoped. The undoped epitaxial semiconductor pillars 11 that are present in the resistor device region 10 extend from the epitaxial semiconductor resistor 26 through the buried dielectric layer 3 to the base semiconductor layer 2 to provide a pathway for heat generated by the epitaxial semiconductor resistor 26 to be dissipated to the base semiconductor layer 2. The thermal conductivity of the undoped epitaxial semiconductor pillars 11 that are present in the resistor device region 10 may be 50 W/m/K or greater. In one embodiment, the thermal conductivity of the undoped epitaxial semiconductor pillars 11 that are present in the resistor device region 10 may range from 50 W/m/K to 200 W/m/K. In another embodiment, the thermal conductivity of the undoped epitaxial semiconductor pillars 11 that are present in the resistor device region 10 may range from 120 W/m/K to 150 W/m/K.

Referring to FIG. 5, in one embodiment, terminals 28 may be present on opposing sides of the epitaxial semiconductor resistor 26. The terminals 28 that are present on opposing sides of the epitaxial semiconductor resistor 26 are separate from one another. In one embodiment, the terminals 28 may be composed of a metal semiconductor alloy. Typically, the metal semiconductor alloy is a silicide. Silicide formation typically requires depositing a refractory metal, such as Ni or Ti, onto the surface of a Si-containing material, such as polysilicon. Following deposition, the structure is then subjected to an annealing step using conventional processes such as, but not limited to, rapid thermal annealing. During thermal annealing, the deposited metal reacts with silicon forming a metal silicide. Examples of silicides suitable for the terminals 28 include, but are not limited to, nickel silicide (NiSi$_x$), nickel platinum silicide (NiPt$_y$Si$_x$), cobalt silicide (CoSi$_x$), tantalum silicide (TaSi$_x$), and titanium silicide (TiSi$_x$). The metal silicide that provides the terminals 28 may also be formed on an upper surface of the raised source regions 22, 24 and the raised drain regions 23, 25.

Figure 6:
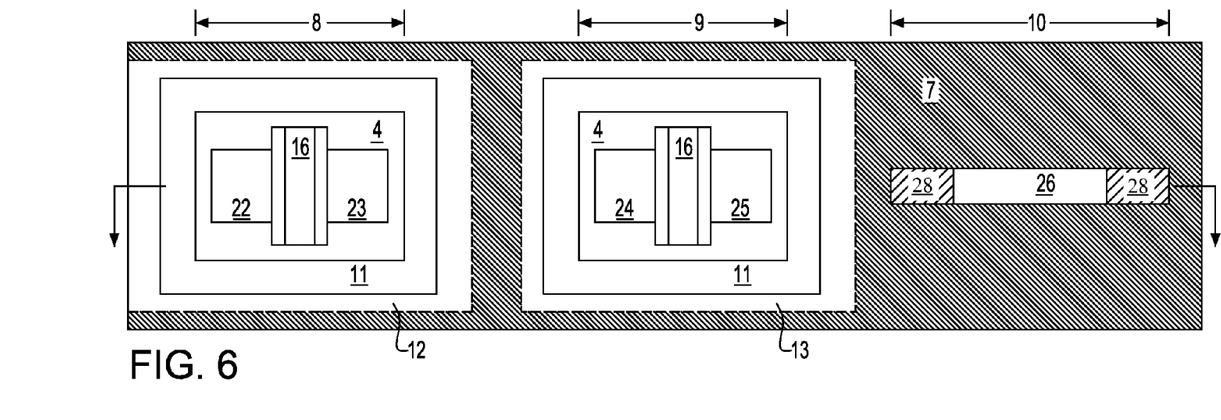
FIG. 6 is a top down perspective view of the structure depicted in FIG. 5.

FIG. 6 is a top down planar view of the electrical device depicted in FIG. 5. The epitaxial semiconductor pillars 11 to the back gate structures 12, 13 may be present around a perimeter of the semiconductor devices that are present in the semiconductor device regions 8, 9, as depicted in FIG. 6.

While the present disclosure has been particularly shown and described with respect to preferred embodiments thereof, it will be understood by those skilled in the art that the foregoing and other changes in forms and details may be made without departing from the scope and spirit of the present disclosure. It is therefore intended that the present disclosure not be limited to the exact forms and details described and illustrated, but fall within the scope of the appended claims.

What is claimed is:

1. A method of forming an electrical device comprising:
providing a substrate including an upper semiconductor layer on a buried dielectric layer, wherein the buried dielectric layer is present on a base semiconductor layer;
forming an isolation region in the substrate through the upper semiconductor layer to define at least one semiconductor device region and a resistor device region;
forming semiconductor pillars in the isolation region and the upper semiconductor layer of the resistor device region, wherein each of the semiconductor pillars is formed through the buried dielectric layer and into contact with the base semiconductor layer and each of the semiconductor pillars consists of an epitaxially deposited semiconductor material, and wherein the semiconductor pillars that are present in the resistor device region are laterally surrounded by the upper semiconductor layer and the buried dielectric layer;
forming a back gate structure in the base semiconductor layer of the at least one semiconductor device region, while a block mask is present over the resistor device region, wherein the semiconductor pillars that are present in the isolation region are in contact with the back gate structure and are doped, while the semiconductor pillars that are present in the resistor device region are protected by the block mask and remain undoped; and epitaxially depositing a raised source region, a raised drain region and an epitaxial semiconductor resistor, wherein the raised source region and the raised drain region are present in the at least one semiconductor device region and the epitaxial semiconductor resistor is present in the resistor device region, wherein the epitaxial semiconductor resistor is in direct contact with the semiconductor pillars present in the resistor device region that remain undoped through which the epitaxial semiconductor resistor is in contact to the base semiconductor layer.

2. The method of claim 1, wherein the semiconductor pillars are formed using an epitaxial deposition process.

3. The method of claim 1, wherein the semiconductor pillars that are present in the resistor device region provide a pathway for heat generated by the epitaxial semiconductor resistor to be dissipated to the base semiconductor layer.

4. The method of claim 1, wherein the forming of the isolation region in the substrate through the upper semiconductor layer to define the at least one semiconductor device region and the resistor device region comprises:
   etching an opening through the upper semiconductor layer selective to the buried dielectric layer;
   depositing a dielectric material to fill the opening that is through the upper semiconductor layer; and
   planarizing an upper surface of the dielectric material to be coplanar with an upper surface of the upper semiconductor layer.

5. The method of claim 1, wherein the at least one semiconductor device region that is defined by placement of the isolation region includes an n-type semiconductor device region and a p-type semiconductor device region.

6. The method of claim 1, wherein the epitaxially deposited semiconductor material comprises a semiconductor selected from the group consisting of silicon (Si), silicon germanium (SiGe), germanium (Ge) and combinations thereof.

7. The method of claim 1, wherein the forming of the back gate structure in the base semiconductor layer of the at least one semiconductor device region comprises:
   forming the block mask over the resistor device region, wherein the at least one semiconductor device is exposed; and
   ion implanting a dopant for the back gate structure at an energy to implant the dopant through the upper semiconductor layer and the buried dielectric layer to a depth within the base semiconductor layer.

8. The method of claim 7, wherein after the forming the back gate structure, the block mask is removed, and a dopant implantation mask is formed exposing the semiconductor pillars that are present in the isolation region that are in contact with the back gate structure, wherein the dopant implantation mask is protecting the resistor device region and portions of the at least one semiconductor device region that do not include the semiconductor pillars that are present in the isolation region.

9. The method of claim 1, wherein a front gate structure is formed on the upper semiconductor layer of the at least one semiconductor device region.

10. The method of claim 9, wherein a source extension region and a drain extension region are formed in the upper semiconductor layer of the at least one semiconductor device region on opposing sides of the front gate structure.

11. The method of claim 1, wherein the epitaxially depositing the raised source region, the raised drain region, and the epitaxial semiconductor resistor further comprises in-situ doping, wherein the raised source region, the raised drain region and the epitaxial semiconductor resistor having a same conductivity.

12. The method of claim 11, wherein the raised source region, the raised drain region and the epitaxial semiconductor resistor are doped to an n-type conductivity, wherein a dopant to provide the n-type conductivity is selected from the group consisting of phosphorus, arsenic, antimony and combinations thereof, or the raised source region, the raised drain region and the epitaxial semiconductor resistor are doped to a p-type conductivity, wherein a dopant to provide the p-type conductivity is selected from the group consisting of boron, indium, gallium and combinations thereof.

13. The method of claim 1, wherein a dopant concentration of the raised source region, the raised drain region and the epitaxial semiconductor resistor is greater than $1 \times 10^{18}$ atoms/$cm^3$.

14. The method of claim 1, wherein the forming the semiconductor pillars in the isolation region and the upper semiconductor layer of the resistor device region comprises:
   forming pillar openings in the isolation region and the resistor device region, wherein the pillar openings in the isolation region extend through the isolation region and the buried dielectric layer to expose portions of the base semiconductor layer, and wherein the pillar openings in the resistor device region extend through the upper semiconductor layer and the buried dielectric layer to expose other portions of the base semiconductor layer; and
   filling the pillar openings with the epitaxially deposited semiconductor material to form the semiconductor pillars.

* * * * *